US012795923B2

(12) United States Patent
Huo et al.

(10) Patent No.: US 12,795,923 B2
(45) Date of Patent: Nov. 10, 2026

(54) BI-DIRECTIONAL CONDUCTIVE SIGNAL PATH FOR A 3D NAND DEVICE AND METHODS OF FABRICATING THE SAME

(71) Applicant: Yangtze Memory Technologies Co., Ltd., Wuhan (CN)

(72) Inventors: Zongliang Huo, Wuhan (CN); Lei Xue, Wuhan (CN); Wenbin Zhou, Wuhan (CN); Zhengliang Xia, Wuhan (CN); Han Yang, Wuhan (CN); Xinwei Zou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 544 days.

(21) Appl. No.: 18/234,329

(22) Filed: Aug. 15, 2023

(65) Prior Publication Data

US 2024/0196607 A1 Jun. 13, 2024

Related U.S. Application Data

(63) Continuation of application No. PCT/CN2023/105887, filed on Jul. 5, 2023.

(30) Foreign Application Priority Data

Dec. 9, 2022 (CN) ......................... 202211596532.7

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 43/27; H10B 41/10; H10B 41/27; H10B 41/35; H10B 41/40; H10B 43/10;
(Continued)

(56) References Cited

U.S. PATENT DOCUMENTS 10,658,378 B2 5/2020 Tao et al.
10,937,801 B2 * 3/2021 Otsu ...................... H10B 41/41
(Continued)

FOREIGN PATENT DOCUMENTS

EP 3667712 6/2020

OTHER PUBLICATIONS

International Search Report and Written Opinion in International Appln. No. PCT/CN2023/105887, mailed on Oct. 18, 2023, 11 pages.

(Continued)

*Primary Examiner* — Cuong B Nguyen
*Assistant Examiner* — Khatib A Rahman
(74) *Attorney, Agent, or Firm* — Hanley, Flight & Zimmerman, LLC

(57) ABSTRACT

3D memory devices are disclosed. In an implementation, a 3D memory device includes a stack structure having a core area and a staircase area. The core area includes conductive layers interleaved with first dielectric layers. Each stair of the staircase area has a different number of conductive layers interleaved with a different number of first dielectric layers. The staircase area has contact structures that penetrate through the first surface, a respective one of the stairs, and dielectric material. Each of the contact structures is electrically connected to a contacting conductive layer of the different number of conductive layers of one of the stairs. The staircase area has second dielectric layers, each of which isolates a remainder of the different number of conductive layers of the respective one of the stairs other (Continued)

than the contacting conductive layer from a respective contact structure.

12 Claims, 10 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/35*** | (2023.01) |
| ***H10B 43/40*** | (2023.01) |
| ***H10W 20/41*** | (2026.01) |

(52) U.S. Cl.
CPC ............. *H10B 41/40* (2023.02); *H10B 43/10* (2023.02); *H10B 43/35* (2023.02); *H10B 43/40* (2023.02); *H10W 20/435* (2026.01)

(58) Field of Classification Search
CPC ........ H10B 43/35; H10B 43/40; H10B 41/50; H10B 43/50; H10W 20/435; H10W 20/076; H10W 20/083; H10W 20/089
See application file for complete search history.

(56) References Cited

U.S. PATENT DOCUMENTS

| | | | | |
|---|---|---|---|---|
| 11,088,088 | B2 * | 8/2021 | Jhothiraman .......... | H10B 41/27 |
| 11,322,440 | B2 * | 5/2022 | Kubo ..................... | H10B 41/10 |
| 11,495,530 | B2 * | 11/2022 | Clampitt .................. | G11C 7/18 |
| 11,574,920 | B2 * | 2/2023 | Kang ..................... | H10B 43/10 |
| 12,185,546 | B2 | 12/2024 | Luo et al. | |
| 2012/0306090 | A1 | 12/2012 | Smith et al. | |
| 2020/0350249 | A1 | 11/2020 | Kim et al. | |
| 2021/0287991 | A1 | 9/2021 | Sun et al. | |
| 2021/0296339 | A1 | 9/2021 | Yamamoto | |
| 2023/0178488 | A1 * | 6/2023 | Luo ........................ | H10B 43/10 257/614 |
| 2024/0196621 | A1 | 6/2024 | Huo et al. | |

OTHER PUBLICATIONS

Communication pursuant to Article 94(3) EPC in European Appln. No. 23748942.2, mailed on Jan. 30, 2026, 6 pages.

* cited by examiner

BI-DIRECTIONAL CONDUCTIVE SIGNAL PATH FOR A 3D NAND DEVICE AND METHODS OF FABRICATING THE SAME

CROSS-REFERENCE TO RELATED APPLICATIONS

This application is a continuation of International Application No. PCT/CN2023/105887, filed on Jul. 5, 2023, which claims priority to Chinese Patent Application No. 202211596532.7, filed on Dec. 9, 2022. The disclosures of the aforementioned applications are hereby incorporated by reference in their entireties.

BACKGROUND

The present disclosure relates to three-dimensional (3D) memory devices and fabrication methods thereof.

Planar memory cells are scaled to smaller sizes by improving process technology, circuit design, programming algorithm, and fabrication processes. However, as feature sizes of the memory cells approach a lower limit, planar process and fabrication techniques become challenging and costly. As a result, memory density for planar memory cells approaches an upper limit. A 3D memory architecture can address the density limitation in planar memory cells. The 3D memory architecture includes a memory array and peripheral devices for controlling signals to and from the memory array.

SUMMARY

This specification describes three-dimensional (3D) memory devices and methods of fabrication. In some aspects of the disclosure a method is disclosed. The method includes providing a stack structure including a core area and a staircase area. The core area includes conductive layers interleaved respectively with first dielectric layers. The staircase area has stairs corresponding to the conductive layers. Each of the stairs has a different number of conductive layers interleaved with a different number of first dielectric layers. The method includes forming holes corresponding to the stairs, wherein each of the holes penetrates through a respective one of the stairs. The method proceeds by depositing a second dielectric layer on sidewalls of each of the holes. Further, the method includes etching, through each of holes in a respective one of the stairs, to expose a portion of a respective contacting conductive layer of the respective conductive layers insulated from the respective hole, wherein the respective contacting conductive layer is a conductive layer of the respective one of the stairs closest to the first surface and furthest from the second surface. Additionally, the method includes depositing one or more conductive materials in each of the holes to come in contact with the respective contacting conductive layer.

In some implementations of the method, etching to expose the portion of the respective contacting conductive layer includes etching to expose a surface of the respective contacting conductive layer.

In some implementations, the method includes etching, through each of the holes, a lateral recess in each of the first dielectric layers using an etching agent by passing the etching agent through a respective one of the holes.

In some implementations of the method, etching to expose the portion of the surface comprises performing top etching, through each of the holes, to open a gap in a respective second dielectric layer.

In some implementations of the method, each of the conductive layers are at least partially circumscribed by a third dielectric layer, and etching to expose the portion of the respective contacting conductive layer comprises performing top etching, through each of the holes, to open a gap in the respective third dielectric layer.

In some implementations, the method continues by depositing one or more conductive materials comprising depositing a metal-containing layer in each of the holes to come in contact with a respective contacting conductive layer.

In some implementations of the method, the metal-containing layer includes titanium nitride.

In some implementations of the method, each two of the adjacent holes are substantially equally spaced.

In some implementations, the third dielectric layer has a higher dielectric constant than the first dielectric layers and the second dielectric layer.

In some implementations of the method, each of the first dielectric layers has substantially a same thickness. The method further includes cutting in a direction orthogonal to the holes through a point substantially centered in a lateral recess in a dielectric layer of the first dielectric layers closest to the second surface to expose the one or more conductive materials in each of the holes.

In some implementations of the method, providing the stack structure includes providing sacrificial layers interleaved respectively with the first dielectric layers, etching the holes through the stack structure, depositing polymer material to each of the holes, replacing the sacrificial layers with the conductive layers, and etching the polymer material to expose the holes.

In some implementations, the method continues by polishing, before etching the polymer material, a surface of the stack structure based on chemical-mechanical polishing.

In some implementations, the sacrificial layers include a nitride material.

In some aspects of the disclosure, a memory device is provided. The memory device includes a stack structure having a first surface and a second surface, wherein the stack structure includes a core area and a staircase area between the first surface and the second surface. The core area includes conductive layers interleaved respectively with first dielectric layers. The staircase area is adjacent to the core area and includes stairs. The stairs correspond to the conductive layers. Each of the stairs has a different number of conductive layers interleaved with a different number of first dielectric layers. The core area includes contact structures that correspond to the stairs. Each of the contact structures penetrates through the top dielectric layer, a respective one of the stairs, and dielectric material filled between the top dielectric layer and the respective one of the stairs, and wherein each of the contact structures is electrically connected to a contacting conductive layer of the different number of conductive layers of the respective one of the stairs. The core area includes second dielectric layers, each of which isolates a remainder of the different number of conductive layers of the respective one of the stairs other than the contacting conductive layer from a respective contact structure.

In some implementations, the second dielectric layer has a gap that exposes a portion of the contacting conductive layer of a respective one of the stairs for the respective contact structure to be electrically connected to the contacting conductive layer through the gap.

In some implementations, each of the conductive layers are at least partially circumscribed by a third dielectric layer. The third dielectric layer has a gap that exposes the portion of the contacting conductive layer of the respective one of the stairs for the respective contact structure is electrically connected to the contacting conductive layer through the gap.

In some implementations, the third dielectric layer has a higher dielectric constant than the first dielectric layers and the second dielectric layers.

In some implementations, a portion of each of the contact structures that penetrates through the respective one of the stairs has a shape, wherein each of the contact structures includes narrow segments interleaved with broad segments that extend along a length of each of the contact structures, and wherein each of the narrow segments has a cross-sectional area that is smaller than a cross-sectional area of each of the broad segments.

In some implementations, a portion of each of the contact structures that penetrates through the dielectric material filled between the top dielectric layer and the respective one of the stairs has a larger diameter than a portion of the respective contact structure that penetrates the respective one of the stairs.

In some implementations, the contact structures are electrically connected to peripheral circuits outside of the first surface and the second surface.

In some implementations, each of the contact structures comprises a metal-containing layer that is electrically connected to the contacting conductive layer of the different number of conductive layers of the respective one of the stairs.

In some implementations, the metal-containing layer comprises titanium nitride.

In some implementations, each two adjacent contact structures are substantially equally spaced.

In some implementations, each of the first dielectric layers has substantially a same thickness, and wherein a dielectric layer of the first dielectric layers closest to the second surface is cut in half in a direction orthogonal to the contact structures to expose cross sections of the contact structures.

Some aspects of the disclosure provide a system. The system includes a memory device configured to store data. The memory device includes a stack structure having a first surface and a second surface, wherein the stack structure includes a core area and a staircase area between the first surface and the second surface. The core area includes conductive layers interleaved respectively with first dielectric layers. The staircase area is adjacent to the core area. The staircase area includes stairs corresponding to the conductive layers. Each of the stairs has a different number of conductive layers interleaved with a different number of first dielectric layers. The staircase area includes contact structures corresponding to the stairs, wherein each of the contact structures penetrates through the first surface, a respective one of the stairs, and dielectric material filled between the first surface and the respective one of the stairs, and wherein each of the contact structures is electrically connected to a contacting conductive layer of the different number of conductive layers of the respective one of the stairs. The staircase area has second dielectric layers, each of which isolates a remainder of the different number of conductive layers of the respective one of the stairs other than the contacting conductive layer from a respective contact structure. A memory controller electrically connects to and controls the memory device.

In some implementations, the second dielectric layer comprises a gap that exposes a portion of the contacting conductive layer of a respective one of the stairs for the respective contact structure to be electrically connected to the contacting conductive layer through the gap.

In some implementations, each of the conductive layers are at least partially circumscribed by a third dielectric layer. The third dielectric layer includes a gap that exposes the portion of the contacting conductive layer of the respective one of the stairs for the respective contact structure is electrically connected to the contacting conductive layer through the gap.

In some implementations, the third dielectric layer has a higher dielectric constant than the first dielectric layers and the second dielectric layers.

In some implementations, a portion of each of the contact structures that penetrates through the respective one of the stairs has a shape, wherein each of the contact structures includes narrow segments interleaved with broad segments that extend along a length of each of the contact structures, and wherein each of the narrow segments has a cross-sectional area that is smaller than a cross-sectional area of each of the broad segments.

In some implementations, a portion of each of the contact structures that penetrates through the dielectric material filled between the top dielectric layer and the respective one of the stairs has a larger diameter than a portion of the respective contact structure that penetrates the respective one of the stairs.

In some implementations, the contact structures are electrically connected to peripheral circuits outside of the first surface and the second surface.

In some implementations, each of the contact structures comprises a metal-containing layer that is electrically connected to the contacting conductive layer of the different number of conductive layers of the respective one of the stairs.

In some implementations, the metal-containing layer includes titanium nitride.

In some implementations, each two adjacent contact structures are substantially equally spaced.

In some implementations, each of the first dielectric layers has substantially a same thickness, and a dielectric layer of the first dielectric layers closest to the second surface is cut in half in a direction orthogonal to the contact structures to expose cross sections of the contact structures.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings. Like reference numbers and designations in the various drawings indicate like elements.

DETAILED DESCRIPTION

Figure 1:
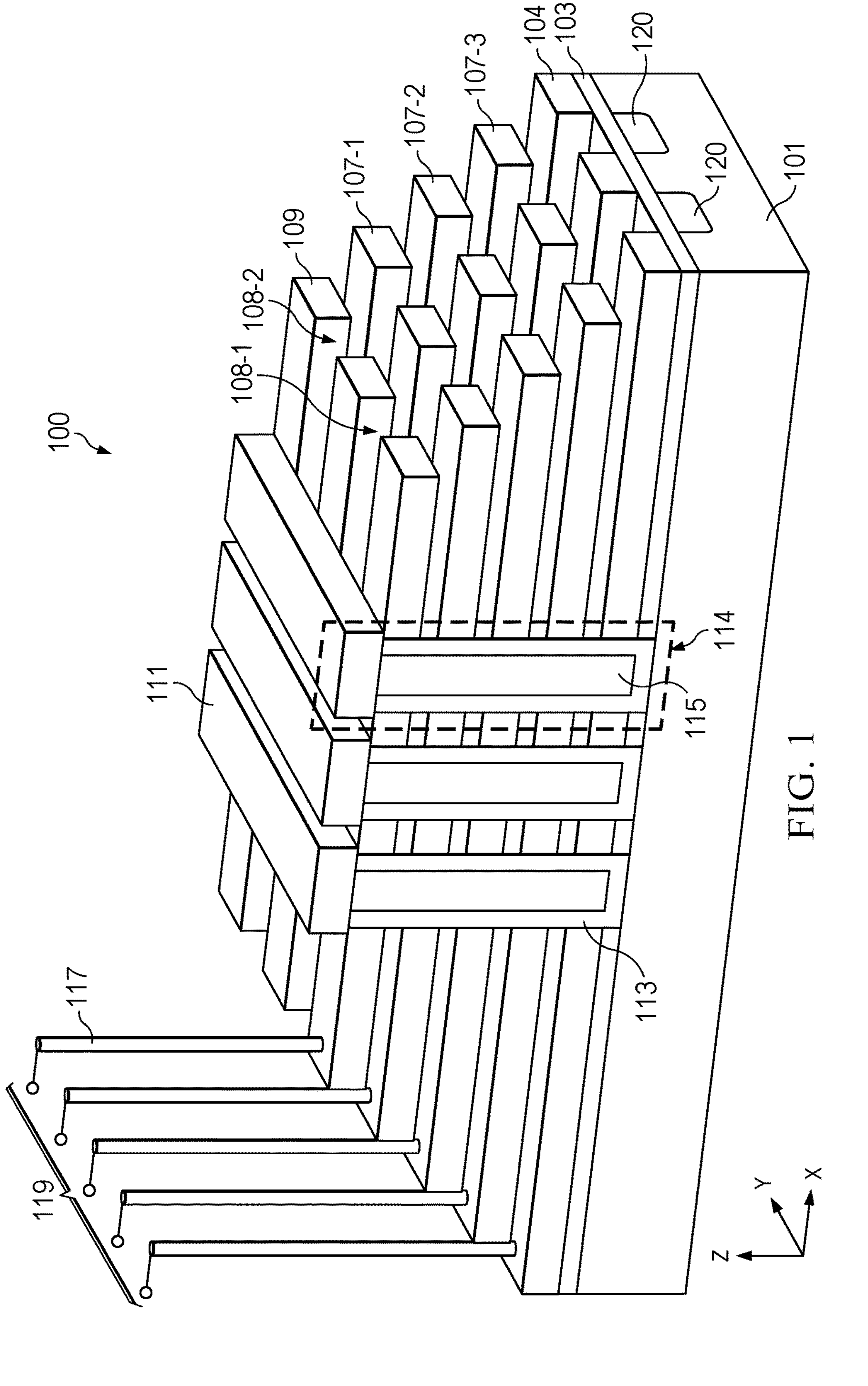
FIG. 1 illustrates a plan view of a 3D memory device having contact structures, according to some aspects of the present disclosure

Although specific configurations and arrangements are discussed, it should be understood that this is done for illustrative purposes only. As such, other configurations and arrangements can be used without departing from the scope of the present disclosure. The present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context.

For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical contacts are formed) and one or more dielectric layers.

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Lithography and etching processes can be used to open contact areas for forming electrical connection in semiconductor structures, such as openings for forming contacts for conductive structures (i.e., word lines), peripheral devices, or substrate contacts. For example, in a 3D NAND memory device, electrical connections such as contact structure contacts are formed by disposing conductive material in openings and connected to the conductive layer on each level of the staircase structure. Electrical connections are also formed to connect peripheral circuitry to other device/structures. Other layers and structures such as metal-containing layers and vias are formed on the staircase structure and peripheral circuitry. Some examples of vias can include via connecting the electrical contacts to the metal lines. Metal lines can be a local interconnect that represents a first interconnect level and electrically connects to an underlying semiconductor device through a via. Other metal lines can be formed in the metal-containing layers.

In some 3D memory devices, such as 3D NAND memory devices, memory cells for storing data are vertically stacked through a stack structure (e.g., a memory stack) in vertical channel structures. 3D memory devices usually include staircase structures formed on one or more sides (edges), or at the center, of the stacked storage structure for purposes such as contact structure pick-up/fan-out using contact structure contacts landed onto different steps/levels of a staircase structure. Dummy channel structures are usually formed through the memory stack in regions outside of the core array region in which the channel structures of 3D NAND memory devices are formed, such as staircase regions having the staircase structures, to provide mechanical support to the stack structure, in particular, during the gate replacement process that temporarily removes some layers of the stack structure through slit openings across the core array region and staircase regions of the stack structure.

As the demand for higher storage capacity continues to increase, the number of vertical levels of the memory cells and staircase structures also increases. For example, a 64-level 3D NAND memory device can include two 32-level staircase structures with one formed on top of the other. Similarly, a 128-level 3D NAND memory device can include two 64-level staircase structures. In the some 3D memory structures, a contact structure is accessed through one or more contacts in a single surface of a 3D memory device. The 3D stack structure of the instant disclosure has contact structures on a top side and bottom side of the 3D stack structure, enabling the 3D stack structure to receive and transmit signals to the contact structures.

To address one or more of the aforementioned issues, embodiments described herein are directed to a conductive structure for a contact structure that provides the conductive contacts disclose herein merge the functionality of signal transmitting lines with the structural advantages of dummy channels. As such, the conductive structure provides structural support to the 3D stack structure, while eliminating the need for additional dummy structures. Moreover, the manufacturing processes is simplified since the conductive structures having structural support capability, requires fewer deposition and etching operations compared to the manufacturing the conventional stack structure.

An overall signal throughput of the 3D memory structures is increased, since both the first surface and second surface of the stack structure have contacts structures (i.e., contact structures) extending therethrough. In addition, depending on where the 3D stack structure is diced, a diameter of the contact can vary between a large diameter and small diameter, due to the periodic gourd-like structure of the contact structure. Accordingly, the disclosed 3D memory structure simplifies the manufacturing process, reduces cost, and increases signal throughput in comparison to memory devices without the conductive contacts, disclosed herein.

FIG. 1 shows an example implementation of 3D NAND flash memory device 100. The flash memory device 100 includes a first substrate 101, an insulating layer 103 over first substrate 101, a tier of bottom select gate electrodes 104 over insulating layer 103, and a plurality of tiers of control gate electrodes 107 (e.g., 107-1, 107-2, and 107-3) stacking on top of bottom select gate electrodes 104. Flash memory device 100 also includes a tier of top select gate electrodes 109 over the stack of control gate electrodes 107, doped source line regions 120 in portions of first substrate 101 between adjacent bottom select gate electrodes 104, and semiconductor channels 114 through top select gate electrodes 109, control gate electrodes 107, bottom select gate electrodes 104, and insulating layer 103. Semiconductor channel 114 (illustrated by a dashed eclipse) includes a memory film 113 over the inner surface of semiconductor channel 114 and a core filling film 115 surrounded by memory film 113 in semiconductor channel 114. The flash memory device 100 further includes a plurality of bitlines 111 disposed on and connected to semiconductor channels 114 over top select gate electrodes 109. A plurality of metal interconnects 119 are connected to the gate electrodes (e.g., 104, 107, and 109) through a plurality of metal contacts 117. During device fabrication, metal interconnects 119 are aligned and connected to metal contacts 117. In some embodiments, metal contacts 117 can be vias formed in insulating layers that are formed between adjacent tiers of gate electrodes. Insulating layers are not shown in FIG. 1 for simplicity. The gate electrodes can also be referred to as the contact structures, which include top select gate electrodes 109, control gate electrodes 107, and bottom select gate electrodes 104.

In FIG. 1, for illustrative purposes, three tiers of control gate electrodes 107-1, 107-2, and 107-3 are shown together with one tier of top select gate electrodes 109 and one tier of bottom select gate electrodes 104. Each tier of gate electrodes have substantially the same height over first substrate 101. The gate electrodes of each tier are separated by gate line slits 108-1 and 108-2 through the stack of gate electrodes. Each of the gate electrodes in a same tier is conductively connected to a metal interconnect 119 through a metal contact 117. That is, the number of metal contacts formed on the gate electrodes equals the number of gate electrodes (i.e., the sum of all top select gate electrodes 109, control gate electrodes 107, and bottom select gate electrodes 104). Further, the same number of metal interconnects is formed to connect to each metal contact 117.

Figure 2:
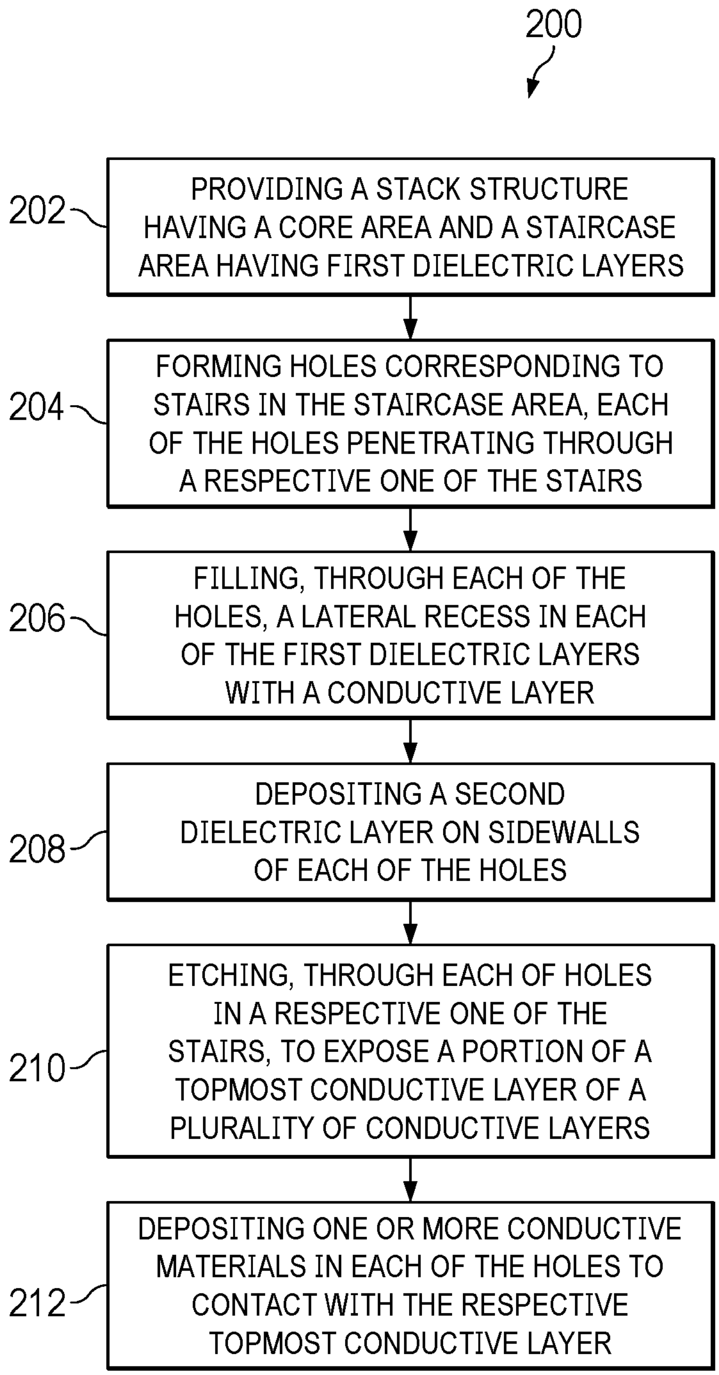
FIG. 2 is a flowchart illustrating a method of forming the 3D memory device shown in FIGS. 1 and 2.
Figure 3:
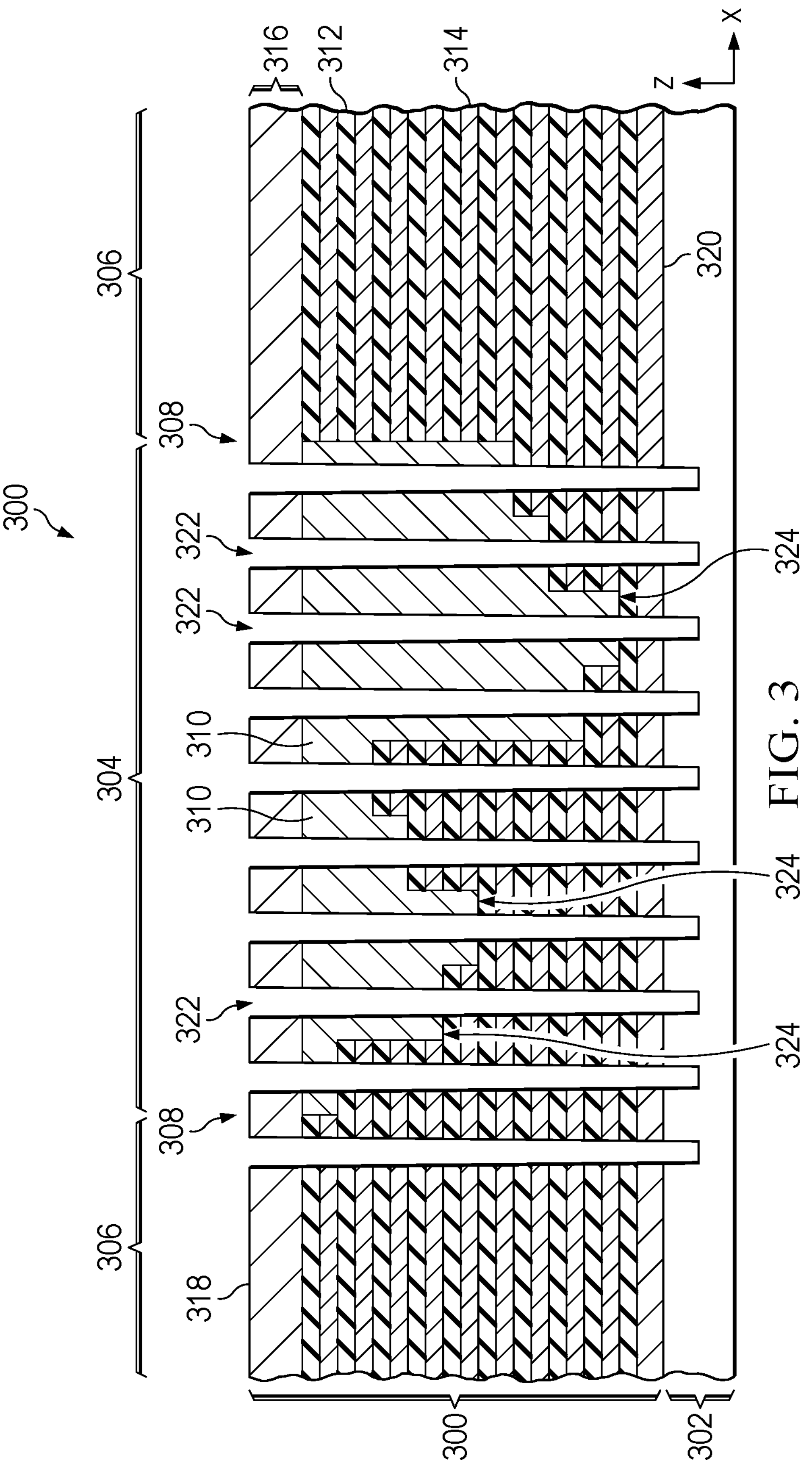
FIG. 3 illustrates a side view of a 3D stack structure having plural interleaved layers.

FIG. 2 is the flowchart of the method of fabricating the 3D memory device 100 shown in FIGS. 1-2. The method 200 begins at operation 202, where a 3D stack structure 300 is provided, as shown in FIG. 3. FIG. 3 illustrates a side view of the 3D stack structure 300 having plural interleaved dielectric and conductive layers. The 3D stack structure 300 has a first surface 318 and a second surface 320, opposite the first surface 318. The dielectric layers, i.e., first dielectric layers 312, second dielectric layers 314, and second insulating layers 316 are disposed between the first surface 318 and the second surface 320.

At operation 202, 3D stack structure 300 is provided. The 3D stack structure 300 includes a staircase structure 304 and a core area 306 that converge at an interface 308. The 3D stack structure 300 has a first surface 318 and a second surface 320, opposite the first surface 318. The 3D stack structure 300 is disposed between the first surface 318 and the second surface 320. The first and second substrates 101, 302 can be any suitable semiconductor material, such as silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof.

The staircase structure 304 (i.e., staircase area) includes a first dielectric layer 312 and second dielectric layer 314 that are interleaved through the 3D stack structure 300. One or more of a second insulating layer 316 is disposed over a topmost first dielectric layer 312.

Figure 5:
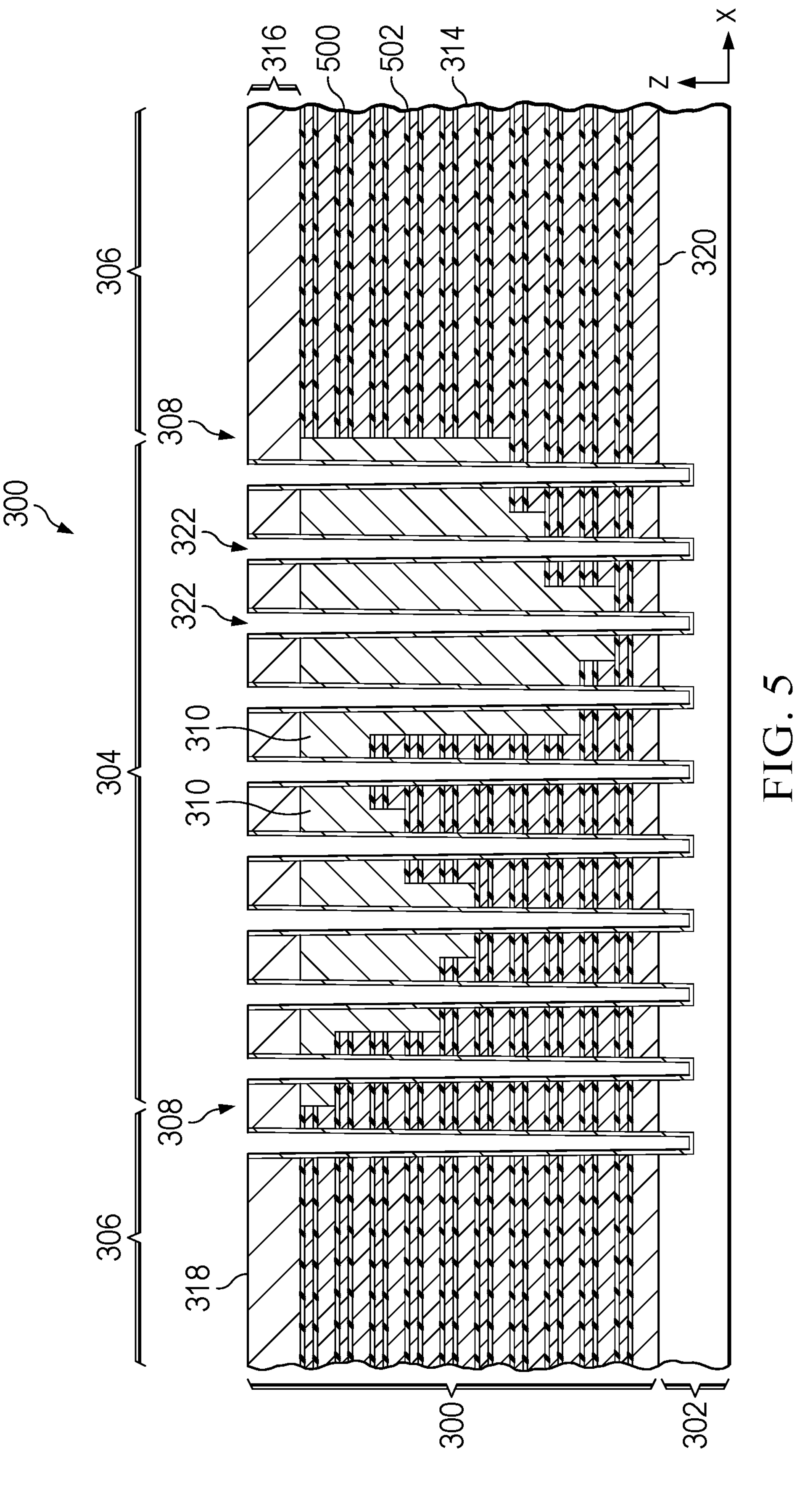
Figure 10:
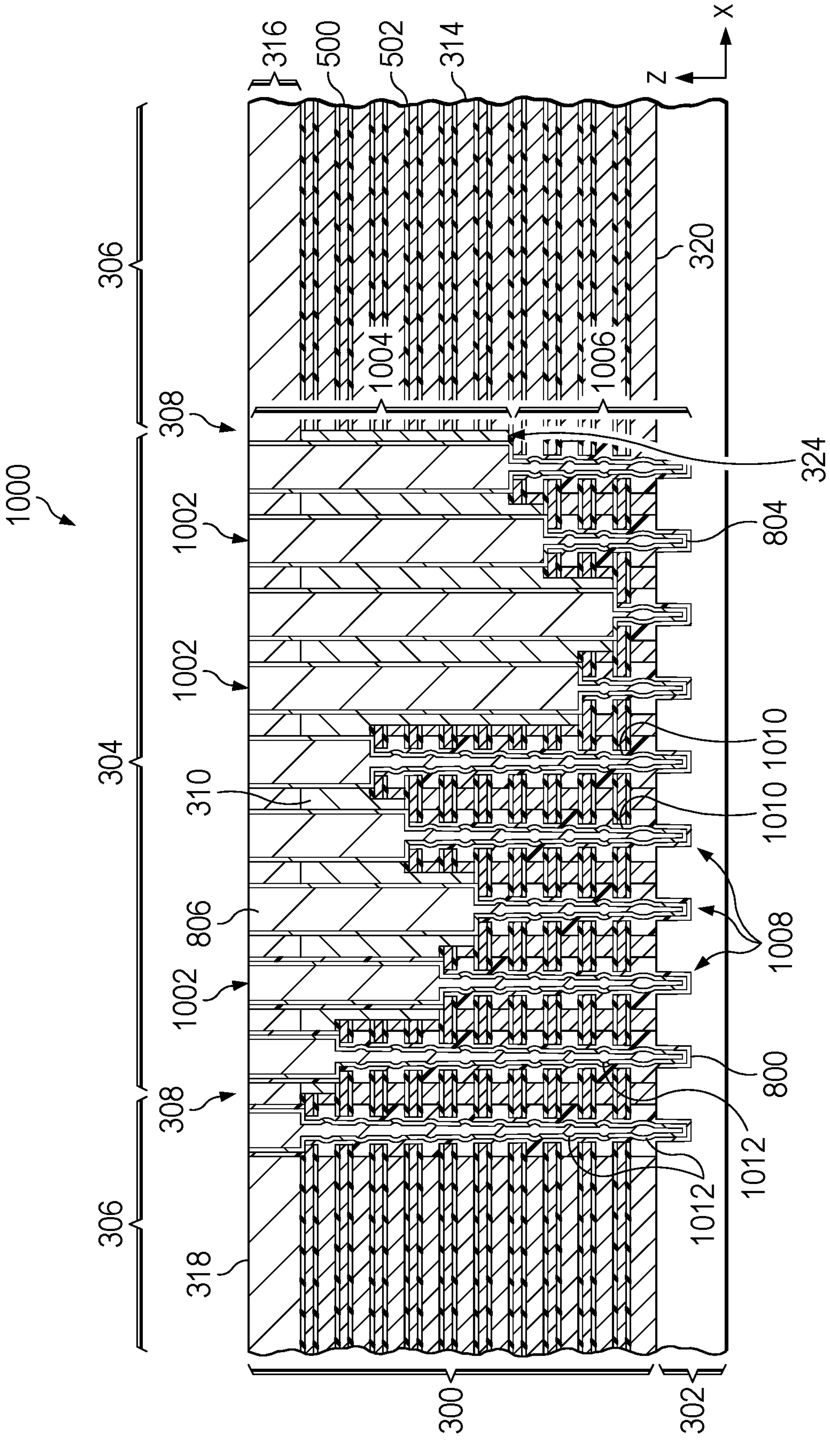

A first insulating layer 310 is disposed in the staircase structure 304 at different vertical heights, creating a stair 324 at a respective interface of the first dielectric layer 312 and the second dielectric layer 314. Each stair 324 includes a portion of a respective first dielectric layer 312 and a second dielectric layer 314. For example, a horizontal length of the first dielectric layer 312 is longer than a horizontal length of the second dielectric layer 314. In this example configuration, each stair 324 includes a vertical surface of the second dielectric layer 314 and a horizontal surface of the first dielectric layer 312. In other implementations, a given stair 324 can have multiple interleaved first dielectric layers 312 and second dielectric layers 314 (or the first conductive layer 500, as illustrated in FIG. 10). As shown in FIGS. 5 and 10, because of the differing vertical heights, each stair 324 can have a different number of conductive layers (i.e., first conductive layer 500) interleaved with a different number of dielectric layers 314, depending on the cross-section at which the stack structure 300 is viewed.

The stack structure 300 has a top dielectric layer (i.e., a second insulating layer 316 or a topmost second dielectric layer 314) having a top surface or first surface and a bottom dielectric layer (i.e., bottommost second dielectric layer 314) having a bottom surface or second surface, and the core area 306 and the staircase structure 304 between the top dielectric layer and the bottom dielectric layer. In other words, the top dielectric layer is a dielectric layer closest to the first surface and furthest from the second surface. The bottom dielectric layer is a dielectric layer closest to the second surface and furthest from the first surface. It should be noted that this disclosure uses the words "top," "bottom," "topmost," and "bottommost" for illustration purposes only in view of the drawings. They can be swapped based on different positionings of the stack structure in different implementations.

In some examples, the first dielectric layer 312 includes an oxide, such as silicon oxide, in one example. The second dielectric layer 314 includes a nitride. In some examples, the second dielectric layer 314 is SiN or TiN.

At operation 204, holes 322 are formed in the staircase structure 304 that correspond to each stair 324. Each of the holes 322 penetrates through a respective one of the stairs 324. The holes 322 extend through the first surface 318 through the second surface 320 of the 3D stack structure 300. The holes 322 terminate in the second substrate 302. Implementations of the fabrication processes for forming the holes 322 include wet etching and/or dry etching, such as deep-ion reactive etching (DRIE). In some implementations, the entire first dielectric layer 312 is removed by etching along a length of a horizontal channel (not shown) formed in the first dielectric layer 312. In some implementations, a portion of the first dielectric layer 312 is removed by etching along a length of a horizontal channel (not shown) formed in the first dielectric layer 312. The film layers, such as the first and second dielectric layers 312, 314 can be formed by one or more film deposition processes that include atomic layer deposition (ALD), chemical vapor deposition (CVD), physical vapor deposition (PVD), any other suitable processes, or any combination thereof. In at least one implementation, each pair (i.e., two) of adjacent holes 322 are substantially equally spaced apart.

Figure 4:
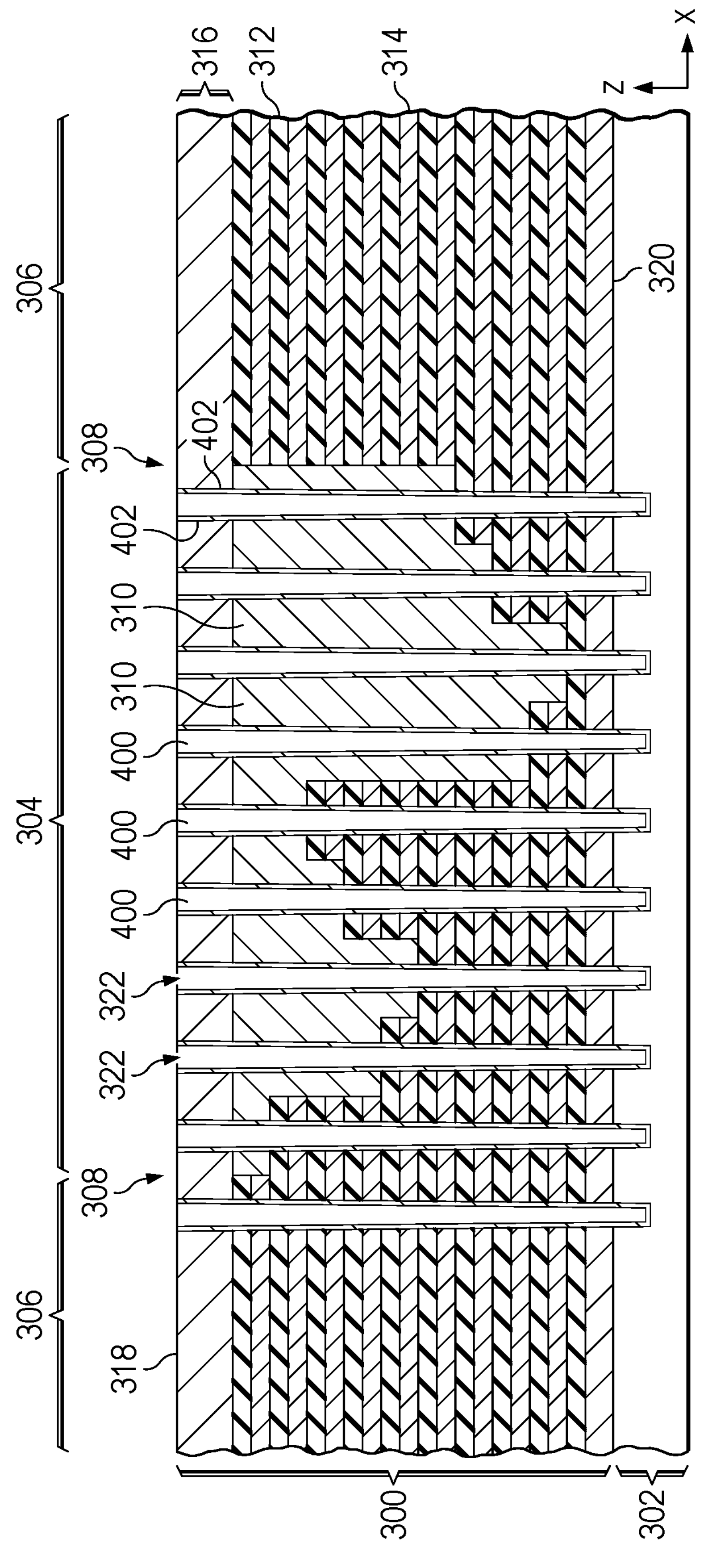
FIGS. 4-10 illustrate the 3D stack structure at various stages of processing during the method illustrated in FIG. 2.

As shown in FIG. 4, after forming the holes 322, a second protective layer 402 is deposited on interior walls of the holes 322. In some implementations, after the interior walls of the holes 322 are insulated with the second protective layer 402, a first protective layer 400 is deposited within the holes 322 over and in contact with the second protective layer 402. In some implementations, a second protective layer 402 overlays and is in contact with the interior walls of holes 322. The first protective layer 400 is disposed over and in contact with the second protective layer 402. The second protective layer 402 and first protective layer 400 can be deposited by a number of deposition techniques, including ALD, CVD, and/or PVD. The first protective layer 400 can be made of a nitride material. Other suitable materials can be implemented without departing from the scope of this disclosure.

After depositing either or both of the first or second protective layers 400, 402 in the holes 322, the first protective layer 400 and/or second protective layer 402 are etched away. In some implementations, the first dielectric layer 312 is removed before one or both first or second protective layers 400, 402 are etched away. For example, the first dielectric layer 312 can be removed by passing liquid etchant through the gate line slits 108-1, 108-2, and refilled with conductive materials to form word lines. The first protective layer 400 can protect the second protective layer 402 from being etched by the liquid etchant, so that the word lines will not be formed within the holes 322.

The first or second protective layers 400, 402 can be made of known dielectrics, which in some implementations can be a passivation layer. A lateral recess is formed having a predetermined length. In some examples, additional layers of a second insulating layer 316 are disposed over the existing second insulating layer 316. The first surface 318 can be smoothed or flattened by chemical mechanical polishing (CMP). For example, before etching the polymer material, (e.g., second insulating layer 316) the top surface, such as 318 first surface, of the stack structure 300 is polished by CMP.

At operation 206, the method 200 proceeds by filling the horizontal channel in each of the first dielectric layers 312 with a first conductive layer 500 via each of the holes 322, as shown in FIG. 5. As described above, an entirety of the first dielectric layer 312 or a portion (i.e., a sacrificial portion) of the first dielectric layer 312 can be removed by etching along the length of the horizontal channel (not shown) formed in the first dielectric layer 312. In some implementations, the sacrificial layers include a nitride material.

As explained above, the first dielectric layer 312 is removed along the predetermined length and replaced by the first conductive layer 500 (shown in FIG. 5). More specifically, the first dielectric layer 312 is etched away in a horizontal direction along the predetermined length. After removal of the first dielectric layer 312, the first conductive layer 500 is deposited in the horizontal channel along the predetermined length.

Before depositing the first conductive layer 500 in the horizontal channel, a high-k dielectric layer 502 is deposited along and in contact with interior walls of the horizontal channel. The first insulating layer 310 and the first dielectric layer 312 contact one another at the interface 308. Because, in some examples, a length of first dielectric layer 312 and first conductive layer 500 can differ in each vertical row of the 3D stack structure 300, a horizontal position of the interface 308 will depend on a given row of the 3D stack structure 300.

After depositing the first conductive layer 500, the core area 306 includes a first conductive layer 500 interleaved with the second dielectric layer 314. Each of the first conductive layers 500 is disposed between a first surface 318 and a second surface 320 of the 3D stack structure 300. In some implementations, the first conductive layer 500 can be deposited using one or more thin film deposition processes, such as ALD, CVD, PVD, any other suitable processes, or any combination thereof. The first conductive layer 500 can be made of tungsten (W) or Cobalt (Co), in some implementation. The high-k dielectric layer 502 can be an oxide material. Other examples of materials used for the high-k dielectric layer 502 include any one of or a combination of aluminum oxide ($Al_2O_3$), Hafnium oxide ($HfO_2$), and Tantalum oxide ($Ta_2O_5$).

Figure 6:
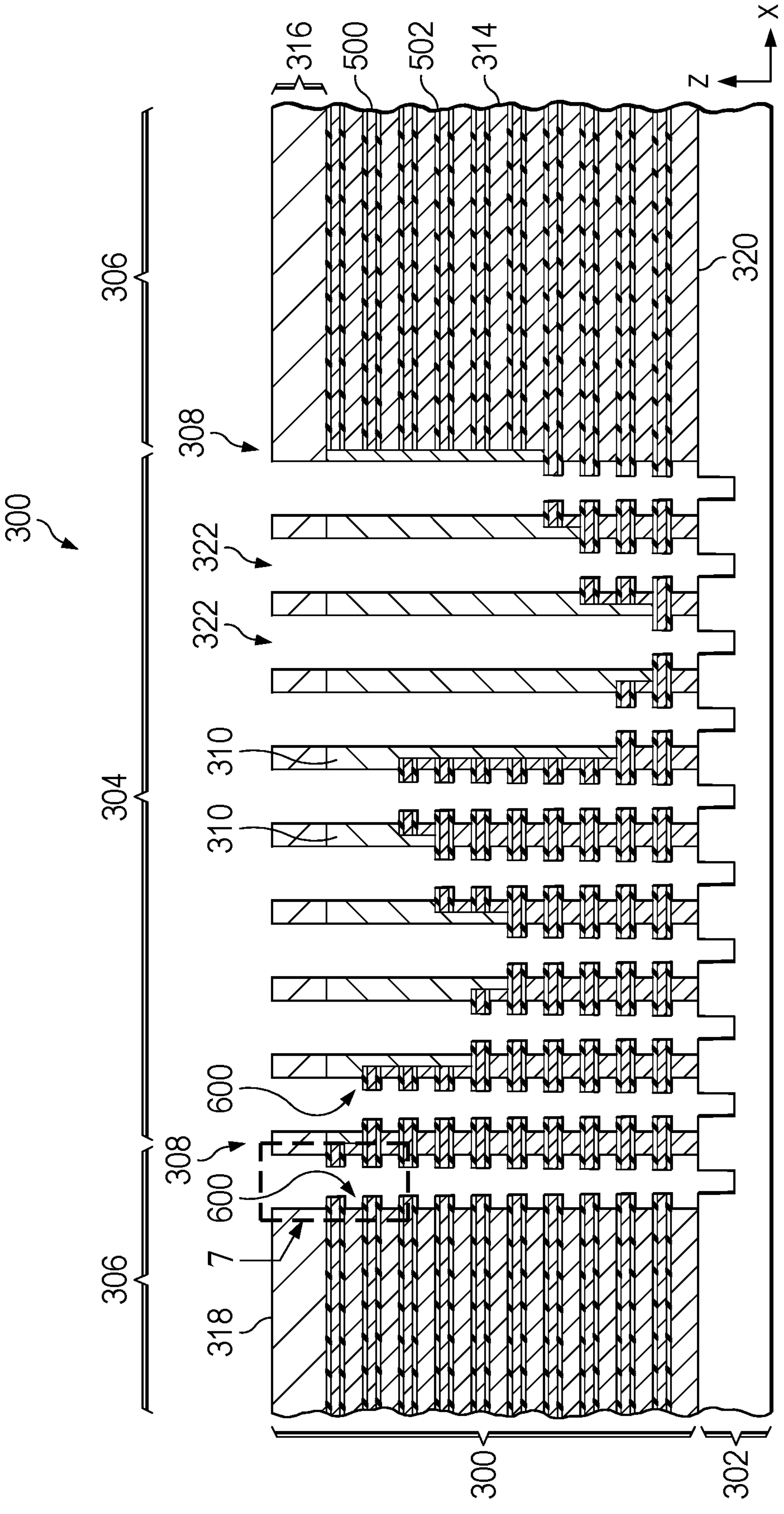

As illustrated in FIG. 6, the method 200 proceeds as horizontal recesses 600 are formed in the holes 322, widening an opening of the holes 322. An etchant widens the holes 322 at the second dielectric layer 314. In one example, the etchant is a gas containing oxide. Other examples of etchants include silicon oxide and nitrous oxide. Because the second protective layer 402 and first conductive layer 500 are made of different materials than the second dielectric layer 314, a high selection ration is achievable in the holes 322. The horizontal recesses 600 includes a first lateral recess 702 and a second lateral recess 704. The first lateral recess 702 has a width that is greater than a width of the second lateral recess 704. For example, the width of the first lateral recess 702 is from 50 nm to 100 nm, such as 60 nm, 70 nm, or 80 nm. The width of the second lateral recess 704 can be between 10% to 50% less than the width of the first lateral recess 702. Considering a group of lateral recesses 702,704, the first lateral recess 702 is etched to the first width at a first position that is different from a second position at which the second lateral recess 704 is formed. The group of lateral recesses 702, 704 extend along the length of the hole 322. Forming the holes 322 includes etching holes 322 (i.e., vertical channels) through the staircase structure 304 (i.e., staircase area). The lateral recesses 600 are formed by etching the first conductive layers 500. A width of each of the lateral recesses 600 is greater than a diameter of each of the holes 322.

Figure 7:
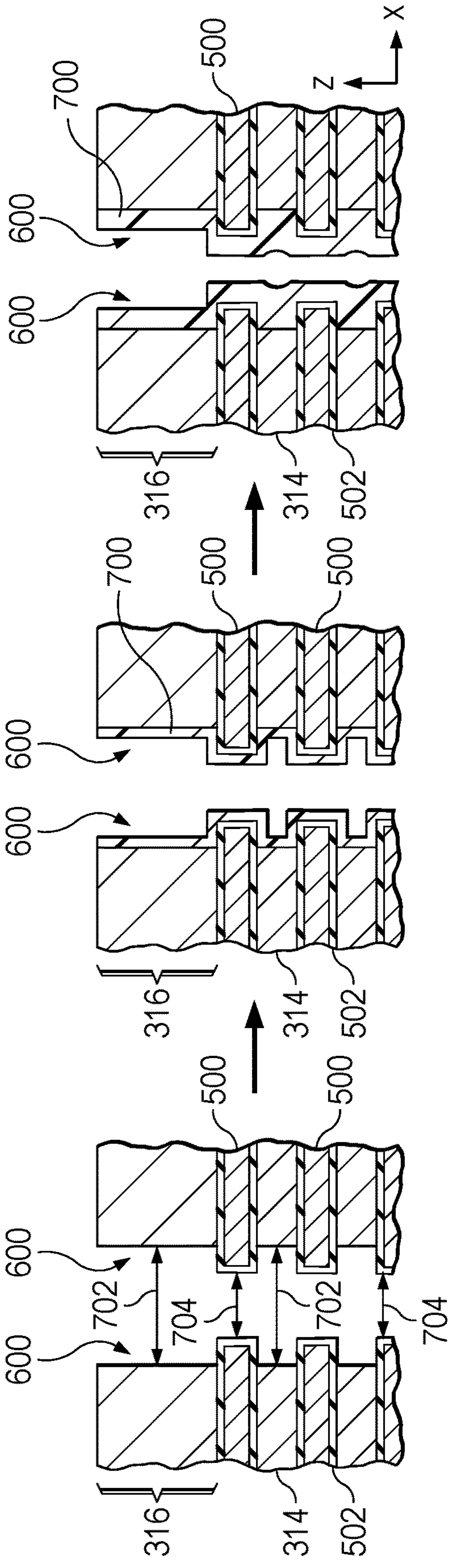

At operation 208, as illustrated in FIG. 7, a third dielectric layer 700 is deposited on sidewalls of each of the holes 322 into the horizontal recesses 600. The third dielectric layer 700 is deposited over and in contact with both the second insulating layer 316 and the high-k dielectric layer 502. Because the high-k dielectric layer 502 circumscribes the first conductive layer 500, the first conductive layer 500 is separated from the third dielectric layer 700 by the high-k dielectric layer 502. Accordingly, the third dielectric layer 700 is in contact with each of the second insulating layers 316 throughout a length of the hole 322. In addition, each of surfaces of the first conductive layer 500 that are exposed to the ambient within the hole 322 are overlaid with the each of the first conductive layers 500 and in contact with exposed surfaces of each of the high-k dielectric layers 502.

Figure 8:
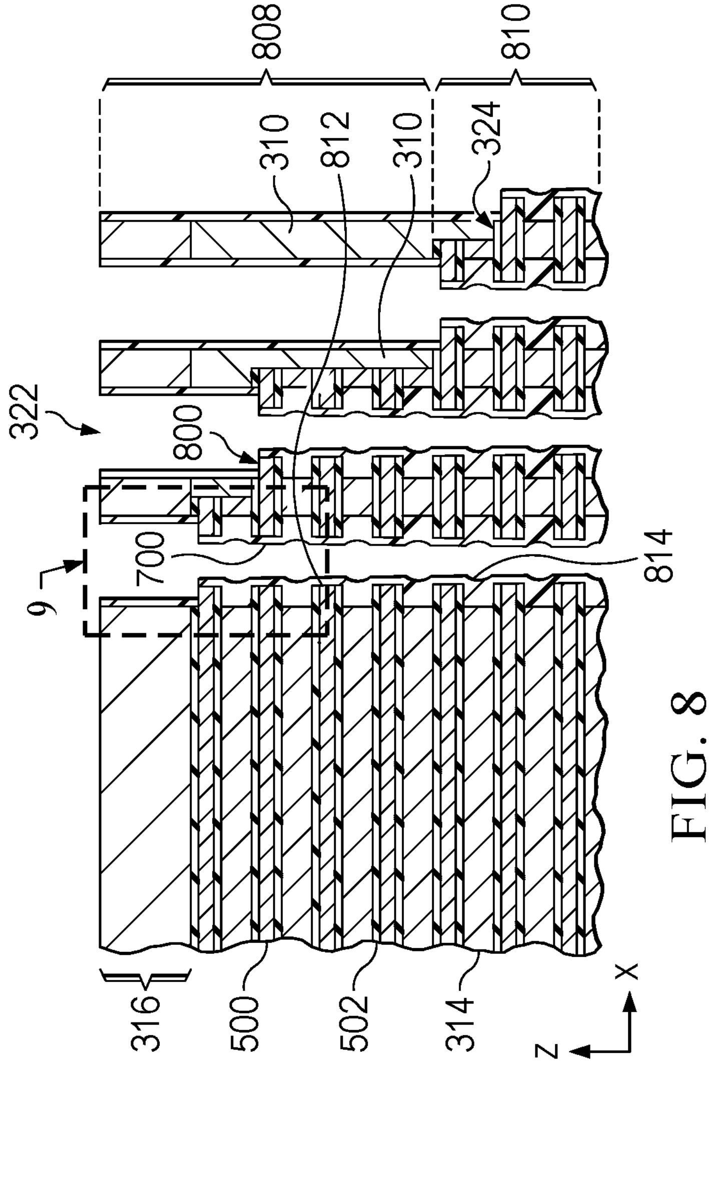

In some implementations, each of the first conductive layers 500 is overlaid by the third dielectric layer 700, but each hole 322 is not filled by an entirety of the third dielectric layer 700. For example, the third dielectric layer 700 can be deposited to a width of between 30 nm and 60 nm, such as about 40 nm, or about 50 nm. A width of the third dielectric layer 700 is such that an opening is not created in the holes 322 enabling leakage between different layers of the first conductive layer 500. In some implementations, after deposition of the third dielectric layer 700, the hole 322 is again etched to form a relatively uniform sidewall of the third dielectric layer 700 in the holes 322, as shown in FIG. 8. The overlaid uniform sidewall of the third dielectric layer 700, as shown in FIG. 8, reduces the width of the horizontal recesses 600 that is illustrated in FIGS. 6 and 7. In some implementations, an entirety of the hole 322 is filled with the third dielectric layer 700. In some implementations, the third dielectric layer 700 is made of an oxide material and is deposited by any one of the aforementioned deposition techniques, such as ALD, CVD, or PVD. In some implementations, the third dielectric layer 700 has a higher dielectric constant than the first dielectric layer 312 and the second dielectric layer 314.

Turning again to FIGS. 8 and 9, the method 200 proceeds to operation 210. Each of the holes 322 in a respective one of the stairs 324 is etched. Etching the holes 322 exposes a portion of a respective topmost portion of the first conductive layer 500 of each of the respective first conductive layer 500 that were insulated by the third dielectric layer 700.

Etching the holes 322, overlaid with the third dielectric layer 700, forms a gap 800 in the high-k dielectric layer 502 so that the first conductive layer 500 is exposed to the ambient. Accordingly, a portion of the high-k dielectric layer 502 is removed during operation 210. As illustrated, etching exposes the topmost first conductive layer 500 in the hole that forms a part of the stair 324 through the gap 800 in the high-k dielectric layer 502. The hole 322 can be etched with an oxide gas similar to the oxides disclosed above. Each of the first conductive layers 500 adjacent to the hole 322, positioned below the topmost first conductive layer 500, are overlaid with the third dielectric layer 700 after the gap 800 is formed. Etching to expose the portion of the first surface 318 (e.g., a top surface) includes performing top surface etching to open the gap 800 in a respective second dielectric layer 314. Each gap 800 is formed by etching the holes 322 through the top surface.

Each of the holes 322 has a first portion 808 that extends from top of the 3D stack structure 300 to the top surface of the respective topmost conductive layer of the conductive layers 500. The first portion 808 has substantially uniform cross-sectional area. The topmost conductive layer of the different number of conductive layers of a respective one of the stairs can be alternatively called a contacting conductive layer of the respective one of the stairs. In other words, the contacting conductive layer is a conductive layer of the respective one of the stairs closest to the first surface and furthest from the second surface. A second portion 810 of the holes 322 extends through the respective stair 324 that interfaces with the first portion 808. The second portion 810 of the holes 322 has narrow segments 812 interleaved with broad segments 814. The narrow segments 812 extend vertically along a length of each of the conductive layers 500. The broad segments 814 extend along a length of each of the first dielectric layers 314. Each of the narrow segments 812 has a cross-sectional area that is smaller than a cross-sectional area of each of the broad segments 814.

Figure 9:
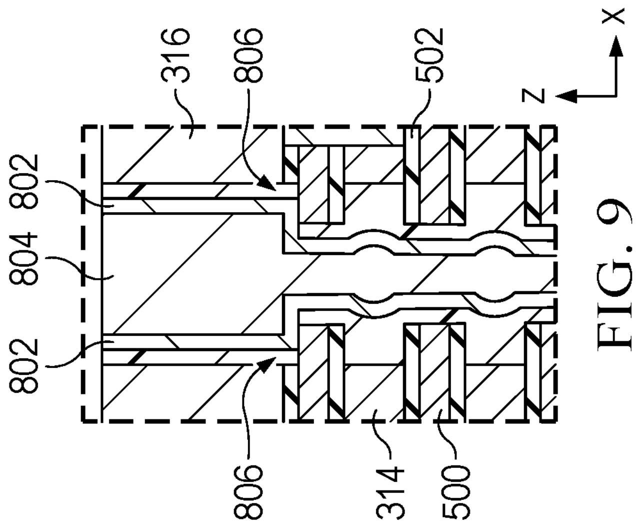

As shown in FIG. 9, at operation 212, the method 200 proceeds by depositing one or more conductive materials in each of the holes to contact with the respective contacting conductive layer. For example, a second conductive layer 802 is deposited in the hole 322 over and in contact with the third dielectric layer 700 and the second insulating layer 316. The second conductive layer 802 overlays the gap 800, creating a direct contact between the first conductive layer 500 and the second conductive layer 802.

A third conductive layer 804 is deposited in the hole 322 over and in contact with the interface 806. The third conductive layer 804 extends through the 3D stack structure 300 into the second substrate 302, as shown in FIG. 10. The second conductive layer 802 is electrically coupled to the first conductive layer 500 through an interface 806. The gap 800 enables the third conductive layer 804 and the second conductive layer 802 to form an electrical coupling at the interface 806. The third conductive layer 804 extends from the first surface 318 through the second surface 320 of the 3D stack structure 300 into the second substrate 302. In some implementations, the third conductive layer 804 includes titanium, such as titanium nitride (TiN) in some implementations. After the electrical coupling at the interface 806 is formed, a contact structure 1002 is created, as explained in more detail below.

FIG. 10 shows the contact structure 1002 disposed in the 3D stack structure 300, forming a 3D memory cell 1000. The contact structure 1002 is formed substantially isotopically, such that a sidewall of the contact structure 1002 is relatively symmetric about an imaginary center extending through a center of the contact structure 1002. A height of the horizontal channel, and thus a height of the contact structures (i.e., the first conductive layer 500), can have a thickness in a range from 10 nm to 100 nm. The contact structure 1002 can have a cylinder shape (e.g., a pillar shape), in at least one example. However, other shapes are feasible without departing from the scope of this disclosure.

Each contact structure 1002 has a first conductive portion 1004 and a second conductive portion 1006. The first conductive portion 1004 is above and in contact with each stair 324. The second conductive portion 1006 is below each stair 324. When a voltage threshold is met at a gate electrode (e.g., 104, 107, and 109, shown in FIG. 1), a signal originating at the memory cell 1000 passes through the first conductive portion 1004 into the first conductive layer 500 through the host 1108. In some examples, the portions of the third conductive layers 804 that penetrate through the first conductive portion 1004 have diameters larger than portions of the third conductive layers 804 that penetrate through the second conductive portion 1006. In some examples, due to the fabrication process such as the ones described in the descriptions of FIGS. 2-9, the portions of the third conductive layers 804 that penetrate through the second conductive portion 1006 has a shape that resembles a string of concatenated bubbles or an irregular borehole, as described in more detail below. The signal may transmit through the second conductive portion 1006 to a terminal end (e.g., the second substrate 302) of the memory cell 1000. Advantageously, some signals may be transmitted to the first conductive layer 500, when the voltage threshold is met, and other signals can be transmitted to the terminal end of the memory cell 1000 or one or more downstream components, such as a metal-oxide layer, or one or more peripherals, as explained below. The contact structure 1002 is one example of a metal contact 117, shown in FIG. 1. Additionally, the second conductive portion 1006 provides mechanical support for the 3D stack structure 300, eliminating the need for dummy structures in the core area 306.

A terminal end of each contact structure 1002 has a back side lead-out 1008 that extends through the second conductive portion 1006 into the second substrate 302. The contact structure 1002 includes narrow segments 1010 interleaved with broad segments 1012 that extend along a length of the second conductive portion 1006. The narrow segments 1010 have a cross-sectional area that is smaller than a cross-sectional area of the broad segments 1012. In some examples, the broad segments 1012 have a bubble shape, and the narrow segments 1010 have a cylindrical shape. Thus, each contact structure 1002 having a plurality of interleaved narrow segments 1010 and broad segments 1012 that have a shape that resembles a string of concatenated bubbles.

As illustrated in FIG. 10, the broad segments 1010 are disposed immediately adjacent to the first conductive layers 500, and the broad segments 1012 are disposed immediately adjacent to the second dielectric layers 314. In the bottom-most second dielectric layer 314 in contact with the second substrate 302, a via landing window can be created in the second conductive portion 1006 of each contact structure 1002. For example, each bottommost broad segment 1012 can be exposed by dicing, segmenting, or etching the bottommost second dielectric layer 314 to expose the broad segments 1012. The via landing window is formed by cutting through the broad segment 1012 in a direction orthogonal to the holes 322 in which the contact structure(s) 1002 are disposed. The broad segment 1012 is segmented (e.g., cut) at a point substantially centered in a lateral recess in a bottommost dielectric layer of the first dielectric layers to expose the one or more conductive materials (i.e., contact structures 1002) in each of the holes 322. In some implementations, the bottommost broad segment 1012 extends vertically into the second substrate 302. Accordingly, the via landing window can also be created in the second substrate 302 in substantially the same manner as detailed above with respect to the bottommost second dielectric layer 314. In other implementations, the via landing window is formed at the interface of the bottommost second dielectric layer 314 and the second substrate 302.

The cross-sectional area of the via landing window is equal to the cross-sectional area of the broad segment 1012. In this manner, the via landing window has a correspondingly large cross-sectional area. The large cross-sectional area of the via landing window in the back side lead-out 1008 enhances the flexibility of external CMOS routing. In this manner, the 3D memory cell 1000 having back side lead-outs 1008 enable multi-device bonding, i.e., back-side bonding at the second surface 320 via the back side lead-out 1008 and front-side bonding at the first surface 318 via the interface 806.

In some examples, a metal-oxide layer (not shown) can be bonded with the 3D memory cell 1000 to form additional framework of the 3D memory device 100, shown in FIG. 1. One or more interconnect structures can be formed, which provide electrical signals between the 3D memory cell 1000 and one or more peripheral devices. The metal-oxide layer can include a substrate, a peripheral circuit layer disposed on the substrate, a contact layer, and a joint layer disposed on the contact layer. Other structures such as through silicon vias (TSVs) electrically couple the metal-oxide layer to the 3D memory cell 1000. Serial etching and deposition may be required to form interconnects and TSVs (not shown). In one example, the metal-oxide layer is a complementary metal-oxide-semiconductor ("CMOS").

Peripheral devices can be formed on the substrate of the metal-oxide layer. For example, an entirety or portion of the peripheral device is formed below a surface of substrate, and/or directly on the surface of the substrate. One or more peripheral devices can include transistors and doped regions to form source/drain regions of the transistors formed on the substrate of the metal-oxide layer. Some examples of peripheral devices include any suitable digital, analog, and/or mixed-signal peripheral circuits used for facilitating the operation of the 3D memory device 100. Additionally, peripheral devices can include one or more of a power bus and metal routing, a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 11:
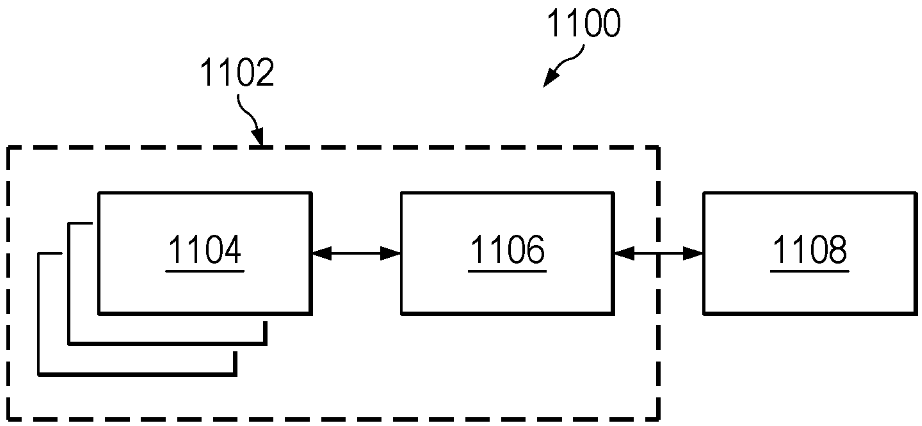
FIG. 11 illustrates a block diagram of a system having a 3D memory device.

FIG. 11 illustrates a block diagram of an example implementation of a system 1100 having a 3D memory cell 1000, according to some aspects of the present disclosure. The system 1100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 11, the system 1100 can include a host 1108 and a memory system 1102 having one or more 3D memory devices 1104 and a memory controller 1106. Host 1108 can be a processor of an electronic device, such as a central processing unit (CPU), or a system-on-chip (SoC), such as an application processor (AP). Host 1108 can be configured to send or receive data to or from 3D memory devices 1104.

In some implementations, each 3D memory device 100 includes a NAND Flash memory. Consistent with the scope of the present disclosure, contact structures can replace the staircase structures and contact structure contacts to achieve contact structure pick-up/fan-out functions, thereby reducing the manufacturing cost and simplifying the fabrication process.

Memory controller 1106 (a.k.a., a controller circuit) is coupled to 3D memory device 100 (shown in FIG. 1) and host 1108 and is configured to control 3D memory device 100, according to some implementations. For example, memory controller 1106 may be configured to operate the plurality of channel structures via the contact structures. Memory controller 1106 can manage the data stored in 3D memory device 100 and communicate with host 1108. In some implementations, memory controller 1106 is designed for operating in a low duty-cycle environment like secure digital (SD) cards, compact Flash (CF) cards, universal serial bus (USB) flash drives, or other media for use in electronic devices, such as personal computers, digital cameras, mobile phones, etc. In some implementations, memory controller 1106 is designed for operating in a high dutycycle environment SSDs or embedded multi-media-cards (eMMCs) used as data storage for mobile devices, such as smartphones, tablets, laptop computers, etc., and enterprise storage arrays. Memory controller 1106 can be configured to control operations of 3D memory device 100, such as read, erase, and program operations. Memory controller 1106 can also be configured to manage various functions with respect to the data stored or to be stored in 3D memory device 100 including, but not limited to bad-block management, garbage collection, logical-to-physical address conversion, wear leveling, etc. In some implementations, memory controller 1106 is further configured to process error correction codes (ECCs) with respect to the data read from or written to 3D memory device 100. Any other suitable functions may be performed by memory controller 1106 as well, for example, formatting 3D memory device 100.

Memory controller 1106 can communicate with an external device (e.g., host 1108) according to a particular communication protocol. For example, memory controller 1106 may communicate with the external device through at least one of various interface protocols, such as a USB protocol, an multimedia card (MMC) protocol, a peripheral component interconnection (PCI) protocol, a PCIexpress (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1106 and one or more 3D memory devices 1104 can be integrated into various types of storage devices, for example, be included in the same package, such as a universal flash storage (UFS) package or an eMMC package. That is, memory system 1102 can be implemented and packaged into different types of end electronic products. In one example, memory controller 1106 and a single 3D memory device 100 may be integrated into a memory card (not shown). The memory card can be a PC card, (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card may include a memory card connector that electrically couples the memory card with the host 1108.

In another example, the memory controller 1106 and multiple 3D memory devices 1104 may be integrated into a solid-state device (SSD) (not shown). The SSD may include an SSD connector electrically coupling the SSD with the host 1108. In some implementations, the storage capacity and/or the operation speed of SSD is greater than those of memory card.

In some aspects of the disclosure a method is disclosed. The method includes providing a stack structure including a core area and a staircase area. The core area includes conductive layers interleaved respectively with first dielectric layers. The staircase area has stairs corresponding to the conductive layers. Each of the stairs has a different number of conductive layers interleaved with a different number of first dielectric layers. The method includes forming holes corresponding to the stairs, wherein each of the holes penetrates through a respective one of the stairs. The method proceeds by depositing a second dielectric layer on sidewalls of each of the holes. Further, the method includes etching, through each of holes in a respective one of the stairs, to expose a portion of a respective contacting conductive layer of the respective conductive layers insulated from the respective hole. Additionally, the method includes depositing one or more conductive materials in each of the holes to come in contact with the respective contacting conductive layer.

In some implementations of the method, etching to expose the portion of the respective contacting conductive layer includes etching to expose a top surface of the respective contacting conductive layer.

In some implementations, the method includes etching, through each of the holes, a lateral recess in each of the first dielectric layers using an etching agent by passing the etching agent through a respective one of the holes.

In some implementations of the method, etching to expose the portion of the contacting conductive layer comprises performing top etching, through each of the holes, to open a gap in a respective second dielectric layer.

In some implementations of the method, each of the conductive layers are at least partially circumscribed by a third dielectric layer, and etching to expose the portion of the contacting conductive layer comprises performing top etching, through each of the holes, to open a gap in the respective third dielectric layer.

In some implementations, the method continues by depositing one or more conductive materials comprising depositing a metal-containing layer in each of the holes to come in contact with a respective contacting conductive layer.

In some implementations of the method, the metal-containing layer includes titanium nitride.

In some implementations of the method, each two of the adjacent holes are substantially equally spaced.

In some implementations, the third dielectric layer has a higher dielectric constant than the first dielectric layers and the second dielectric layer.

In some implementations of the method, each of the first dielectric layers has substantially a same thickness. The method further includes cutting in a direction orthogonal to the holes through a point substantially centered in a lateral recess in a dielectric layer of the first dielectric layers closest to the second surface to expose the one or more conductive materials in each of the holes.

In some implementations of the method, providing the stack structure includes providing sacrificial layers interleaved respectively with the first dielectric layers, etching the holes through the stack structure, depositing polymer material to each of the holes, replacing the sacrificial layers with the conductive layers, and etching the polymer material to expose the holes.

In some implementations, the method continues by polishing, before etching the polymer material, a top surface of the stack structure based on chemical-mechanical polishing.

In some implementations, the sacrificial layers include a nitride material.

In some aspects of the disclosure, a memory device is provided. The memory device includes a stack structure having a first surface and a second surface, and a core area and a staircase area between the first surface and the second surface. The core area includes conductive layers interleaved respectively with first dielectric layers. The staircase area is adjacent to the core area and includes stairs. The stairs correspond to the conductive layers. Each of the stairs has a different number of conductive layers interleaved with a different number of first dielectric layers. The core area includes contact structures that correspond to the stairs. Each of the contact structures penetrates through the top dielectric layer, a respective one of the stairs, and dielectric material filled between the top dielectric layer and the respective one of the stairs, and wherein each of the contact structures is electrically connected to a contacting conductive layer of the different number of conductive layers of the respective one of the stairs. The core area includes second dielectric layers, each of which isolates a remainder of the different number of conductive layers of the respective one of the stairs other than the contacting conductive layer from a respective contact structure.

In some implementations, the second dielectric layer has a gap that exposes a portion of a top surface of a contacting conductive layer of a respective one of the stairs for the respective contact structure to be electrically connected to the contacting conductive layer through the gap.

In some implementations, each of the conductive layers are at least partially circumscribed by a third dielectric layer. The third dielectric layer has a gap that exposes the portion of the top surface of the contacting conductive layer of the respective one of the stairs for the respective contact structure is electrically connected to the contacting conductive layer through the gap.

In some implementations, the third dielectric layer has a higher dielectric constant than the first dielectric layers and the second dielectric layers.

In some implementations, a portion of each of the contact structures that penetrates through the respective one of the stairs has a shape, wherein each of the contact structures includes narrow segments interleaved with broad segments that extend along a length of each of the contact structures, and wherein each of the narrow segments has a cross-sectional area that is smaller than a cross-sectional area of each of the broad segments.

In some implementations, a portion of each of the contact structures that penetrates through the dielectric material filled between the top dielectric layer and the respective one of the stairs has a larger diameter than a portion of the respective contact structure that penetrates the respective one of the stairs.

In some implementations, the contact structures are electrically connected to peripheral circuits outside of the first surface and the second surface.

In some implementations, each of the contact structures comprises a metal-containing layer that is electrically connected to the contacting conductive layer of the different number of conductive layers of the respective one of the stairs.

In some implementations, the metal-containing layer comprises titanium nitride.

In some implementations, each two adjacent contact structures are substantially equally spaced.

In some implementations, each of the first dielectric layers has substantially a same thickness, and wherein a dielectric layer of the first dielectric layers closest to the second surface is cut in half in a direction orthogonal to the contact structures to expose cross sections of the contact structures.

Some aspects of the disclosure provide a system. The system includes a memory device configured to store data. The memory device includes a stack structure having a first surface and a second surface, and a core area and a staircase area between the first surface and the second surface. The core area includes conductive layers interleaved respectively with first dielectric layers. The staircase area is adjacent to the core area. The staircase area includes stairs corresponding to the conductive layers. Each of the stairs has a different number of conductive layers interleaved with a different number of first dielectric layers. The staircase area includes contact structures corresponding to the stairs, wherein each of the contact structures penetrates through the top dielectric layer, a respective one of the stairs, and dielectric material filled between the top dielectric layer and the respective one of the stairs, and wherein each of the contact structures is electrically connected to a contacting conductive layer of the different number of conductive layers of the respective one of the stairs. The staircase area has second dielectric layers, each of which isolates a remainder of the different number of conductive layers of the respective one of the stairs other than the contacting conductive layer from a respective contact structure. A memory controller electrically connects to and controls the memory device.

In some implementations, the second dielectric layer comprises a gap that exposes a portion of a contacting conductive layer of a respective one of the stairs for the respective contact structure to be electrically connected to the contacting conductive layer through the gap.

In some implementations, each of the conductive layers are at least partially circumscribed by a third dielectric layer. The third dielectric layer includes a gap that exposes the portion of the contacting conductive layer of the respective one of the stairs for the respective contact structure is electrically connected to the contacting conductive layer through the gap.

In some implementations, the third dielectric layer has a higher dielectric constant than the first dielectric layers and the second dielectric layers.

In some implementations, a portion of each of the contact structures that penetrates through the respective one of the stairs has a shape, wherein each of the contact structures includes narrow segments interleaved with broad segments that extend along a length of each of the contact structures, and wherein each of the narrow segments has a cross-sectional area that is smaller than a cross-sectional area of each of the broad segments.

In some implementations, a portion of each of the contact structures that penetrates through the dielectric material filled between the top dielectric layer and the respective one of the stairs has a larger diameter than a portion of the respective contact structure that penetrates the respective one of the stairs.

In some implementations, the contact structures are electrically connected to peripheral circuits outside of the first surface and the second surface.

In some implementations, each of the contact structures comprises a metal-containing layer that is electrically connected to the contacting conductive layer of the different number of conductive layers of the respective one of the stairs.

In some implementations, the metal-containing layer includes titanium nitride.

In some implementations, each two adjacent contact structures are substantially equally spaced.

In some implementations, each of the first dielectric layers has substantially a same thickness, and a dielectric layer of the first dielectric layers closest to the second surface is cut in half in a direction orthogonal to the contact structures to expose cross sections of the contact structures.

While this specification contains many specific implementation details, these should not be construed as limitations on the scope of what is being claimed, which is defined by the claims themselves, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The foregoing description of the specific implementations can be readily modified and/or adapted for various applications. Therefore, such adaptations and modifications are intended to be within the meaning and range of equivalents of the disclosed implementations, based on the teaching and guidance presented herein. The breadth and scope of the present disclosure should not be limited by any of the above-described implementations, but should be defined only in accordance with the following claims and their equivalents.

What is claimed is:

1. A memory device, comprising:

a stack structure having a first surface and a second surface, wherein the stack structure includes a core area and a staircase area between the first surface and the second surface; wherein the core area includes conductive layers interleaved respectively with first dielectric layers; and wherein the staircase area is adjacent to the core area and comprises:

stairs corresponding to the conductive layers, wherein each of the stairs comprises a different number of conductive layers interleaved with a different number of first dielectric layers;

contact structures corresponding to the stairs, wherein each of the contact structures penetrates through the first surface, a respective one of the stairs, and dielectric material filled between the first surface and the respective one of the stairs, and wherein each of the contact structures is electrically connected to a contacting conductive layer of the different number of conductive layers of the respective one of the stairs, wherein the contacting conductive layer is a conductive layer of the respective one of the stairs closest to the first surface and furthest from the second surface; and second dielectric layers, each of which isolates a remainder of the different number of conductive layers of the respective one of the stairs other than the contacting conductive layer from a respective contact structure.

2. The memory device of claim 1, wherein each of the second dielectric layers comprises a gap that exposes a portion of a respective contacting conductive layer for the respective contact structure to be electrically connected to the respective contacting conductive layer through the gap.

3. The memory device of claim 2, wherein each of the conductive layers are at least partially circumscribed by a third dielectric layer, and wherein the third dielectric layer comprises a gap that exposes the portion of the respective contacting conductive layer of the respective one of the stairs for the respective contact structure is electrically connected to the contacting conductive layer through the gap.

4. The memory device of claim 3, wherein the third dielectric layer has a higher dielectric constant than the first dielectric layers and the second dielectric layers.

5. The memory device of claim 1, wherein a portion of each of the contact structures penetrates through the respective one of the stairs, wherein the portion comprises narrow segments interleaved with broad segments, wherein the narrow segments extend along a length of each of the conductive layers and the broad segments extend along a length of each of the first dielectric layers, wherein each of the narrow segments has a cross-sectional area that is smaller than a cross-sectional area of each of the broad segments.

6. The memory device of claim 1, wherein a portion of each of the contact structures that penetrates through the dielectric material filled between the first surface and the respective one of the stairs has a larger diameter than a portion of the respective contact structure that penetrates the respective one of the stairs.

7. The memory device of claim 1, wherein the contact structures are electrically connected to peripheral circuits outside of the first surface or the second surface.

8. The memory device of claim 1, wherein each of the contact structures comprises a metal-containing layer that is electrically connected to the contacting conductive layer of the different number of conductive layers of the respective one of the stairs.

9. The memory device of claim 8, wherein the metal-containing layer comprises titanium nitride.

10. The memory device of claim 1, wherein each two adjacent contact structures are substantially equally spaced.

11. The memory device of claim 1, wherein each of the first dielectric layers has substantially a same thickness, and wherein a dielectric layer of the first dielectric layers closest to the second surface is cut in half in a direction orthogonal to the contact structures to expose cross sections of the contact structures.

12. A system, comprising:

a memory device configured to store data, the memory device comprising:

a stack structure having a first surface and a second surface, wherein the stack structure includes a core area and a staircase area between the first surface and the second surface; wherein the core area includes conductive layers interleaved respectively with first dielectric layers; and wherein the staircase area is adjacent to the core area and comprises:

stairs corresponding to the conductive layers, wherein each of the stairs comprises a different number of conductive layers interleaved with a different number of first dielectric layers;

contact structures corresponding to the stairs, wherein each of the contact structures penetrates through the first surface, a respective one of the stairs, and dielectric material filled between the first surface and the respective one of the stairs, and wherein each of the contact structures is electrically connected to a contacting conductive layer of the different number of conductive layers of the respective one of the stairs, wherein the respective contacting conductive layer is a conductive layer of the respective one of the stairs closest to the first surface and furthest from the second surface; and second dielectric layers, each of which isolates a remainder of the different number of conductive layers of the respective one of the stairs other than the contacting conductive layer from a respective contact structure; and a memory controller that electrically connects to and controls the memory device.

* * * * *